(12) United States Patent
Saito et al.

(10) Patent No.: US 7,554,650 B2
(45) Date of Patent: Jun. 30, 2009

(54) LASER BEAM PROJECTING DEVICE

(75) Inventors: Michiyo Saito, Itabashi-ku (JP);
Kunihiro Hayashi, Itabashi-ku (JP)

(73) Assignee: Kabushiki Kaisha TOPCON, Tokyo-to (JP)

( * ) Notice: Subject to any disclaimer, the term of this patent is extended or adjusted under 35 U.S.C. 154(b) by 0 days.

(21) Appl. No.: 12/157,773

(22) Filed: Jun. 13, 2008

(65) Prior Publication Data

US 2008/0252875 A1      Oct. 16, 2008

(51) Int. Cl.
*G01C 3/00*          (2006.01)

(52) U.S. Cl. ............... 356/3.15; 356/3.1; 356/3.01; 359/668

(58) Field of Classification Search .......... 356/3.01–22; 372/9–32
See application file for complete search history.

(56) References Cited

U.S. PATENT DOCUMENTS

| | | | |
|---|---|---|---|
| 5,157,459 A | 10/1992 | Oono et al. | 356/520 |
| 5,453,859 A * | 9/1995 | Sannohe et al. | 349/9 |
| 5,825,555 A * | 10/1998 | Oono et al. | 359/668 |
| 6,609,795 B2 | 8/2003 | Weber et al. | 353/20 |
| 6,704,339 B2 | 3/2004 | Lublin et al. | 372/57 |
| 2006/0028726 A1 | 2/2006 | Ushigome | 359/500 |

OTHER PUBLICATIONS

J. Stone, L. W. Stulz, FiEnd Filters: Passive Multilayer Thin-Film Optical Filters Deposited on Fibre Ends, Aug. 2, 1990, Electronics Letters, vol. 26, No. 16, pp. 1290-1291.
Office action dated Nov. 27, 2006.
Office action dated May 18, 2007.
Office action dated Aug. 27, 2007.
Office action dated Feb. 14, 2008.

\* cited by examiner

*Primary Examiner*—Thomas H Tarcza
*Assistant Examiner*—Luke D Ratcliffe
(74) *Attorney, Agent, or Firm*—Nields, Lemack & Frame, LLC

(57) ABSTRACT

A laser beam projecting device, comprising a laser light source for emitting a laser beam, a wavelength selecting film for allowing the laser beam from the laser light source to. pass, and a birefringent optical member arranged on an optical axis closer to an exit side than the wavelength selecting film, wherein the wavelength selecting film is tilted so that an incident angle of the laser beam is in a range of 45° to 80°.

7 Claims, 5 Drawing Sheets

LASER BEAM PROJECTING DEVICE

BACKGROUND OF THE INVENTION

The present invention relates to a laser beam projecting device comprising structure for shutting off a return beam of a laser beam emitted from a laser light source.

It is known that output of a laser light source for emitting a laser beam is decreased when there is a return beam, and a surveying system utilizing the laser beam has an arrangement to shut off the return beam.

FIG. 7 shows general features of an optical system of a conventional type laser beam projecting device, which has an operation to shut off the return beam.

In FIG. 7, reference numeral 1 denotes a semiconductor laser, and reference numeral 2 denotes a condenser lens. Reference numeral 3 denotes an anamorphic prism, which comprises two wedge-like prisms 4a and 4b having different collection angles in two directions of cross-section of luminous flux. After passing through the anamorphic prism 3, a laser beam 5 is projected on a projection optical axis 6. On the projection optical axis 6, there are arranged a polarizing plate 7 for transmittig P-polarized light and a ¼λ plate (birefringent optical component) 8. Reference numeral 9 denotes an optical component for reflecting the laser beam 5. The optical component is a reflecting mirror, for instance.

The laser beam 5 emitted from the semiconductor laser 1 is, for instance, a linearly P-polarized light, and cross-section of luminous flux of the laser beam 5 is in elliptical shape. After the laser beam 5 is turned to parallel luminous flux by the condenser lens 2, the cross-section of the luminous flux of the laser beam 5 is expanded in a short axis direction by the two wedge-like prisms 4a and 4b of the anamorphic prism 3, and the laser beam 5 is shaped so that the cross-section of the luminous flux has circular shape.

After passing through the anamorphic prism 3, the laser beam 5 with the luminous flux turned to circular shape passes through the polarizing plate 7. The laser beam 5 is then converted to a circularly polarized light by the ¼λ plate 8 and is projected.

Being reflected by the optical component 9, the circularly polarized reflected laser beam 5' is converted to a linearly polarized light as the reflected laser beam 5' passes through the ¼λ plate 8. Further, the linearly polarized reflected laser beam 5' thus converted has a direction of polarization different by 90° with respect to the projected laser beam 5, and the reflected laser beam 5' becomes S-polarized light. The polarizing plate 7 is arranged so as to allow the P-polarized light to pass. Accordingly, the S-polarized reflected laser beam 5' is shut off by the polarizing plate 7 and does not reach the semiconductor laser 1.

In the conventional type laser beam projecting device as described above, the returning of the reflected laser beam 5' is shut off by a combination of the polarizing plate 7 and the ¼λ plate 8 arranged on the projection optical axis 6, and the polarizing plate 7 is required to be arranged on the projection optical axis 6. This results in complicated structure of the optical system. Also, as the polarizing plate 7 is provided, reflection occurs on both surfaces of the polarizing plate 7, and this causes loss of the laser beam.

SUMMARY OF THE INVENTION

It is an object of the present invention to provide a laser beam projecting device, by which it is possible to shut off a return beam without separately providing a polarizing plate, and to simplify structure of the laser beam projecting device.

To attain the above object, the present invention provides a laser beam projecting device, which comprises a laser light source for emitting a laser beam, a wavelength selecting film for allowing the laser beam from the laser light source to pass, and a birefringent optical member arranged on an optical axis closer to an exit side than the wavelength selecting film, wherein the wavelength selecting film is tilted so that an incident angle of the laser beam is in a range of 45° to 80°. Also, the present invention provides the laser beam projecting device as described above, wherein the laser beam projecting device has an anamorphic prism, and the wavelength selecting film is formed on one surface of wedge-like prisms, which constitute the anamorphic prism. Further, the present invention provides the laser beam projecting device as describe above, wherein the wavelength selecting film is formed on an incident surface, which is tilted at a range of 45° to 80° with respect to the laser beam entering to the anamorphic prism. Also, the present invention provides the laser beam projecting device as described above, wherein the wavelength selecting film is tilted in such manner that the incident angle of the laser beam is in a range of 60° to 70°. Further, the present invention provides the laser beam projecting device as described above, wherein the wavelength selecting film is determined depending on a wavelength and an incident angle of the laser beam. Also, the present invention provides the laser beam projecting device as described above, wherein the wavelength selecting film is a long-pass filter or a short-pass filter.

According to the present invention, there are provided a laser light source for emitting a laser beam, a wavelength selecting film for allowing the laser beam from the laser light source to pass, and a birefringent optical member arranged on an optical axis closer to an exit side than the wavelength selecting film, and the wavelength selecting film is tilted so that an incident angle of the laser beam is in a range of 45° to 80°. As a result, the wavelength selecting film has difference in transmission characteristics between the P-polarizing component and the S-polarizing component, and the wavelength selecting film fulfills a function as a polarizing plate. Thus, it is possible to shut off the return beam without providing a polarizing plate separately, and this makes it possible to design an optical system with simplified structure.

According to the present invention, the laser beam projecting device has an anamorphic prism, and the wavelength selecting film is formed on one surface of wedge-like prisms, which constitute the anamorphic prism. Thus, the return beam can be shut off without providing a polarizing plate separately, and this leads to the simplified structure of the optical system.

BRIEF DESCRIPTION OF THE DRAWINGS

FIG. 2 (A) shows a case where the incident angle is 0°, FIG. 2 (B) shows a case where the incident angle is 45°, and FIG. 2 (C) a case where the incident angle is 60°.

FIG. 3 (A) shows a case where the incident angle is 0°, FIG. 3 (B) shows a case where the incident angle is 45°, and FIG. 3 (C) a case where the incident angle is 60°.

DETAILED DESCRIPTION OF THE PREFERRED EMBODIMENT

Figure 1:
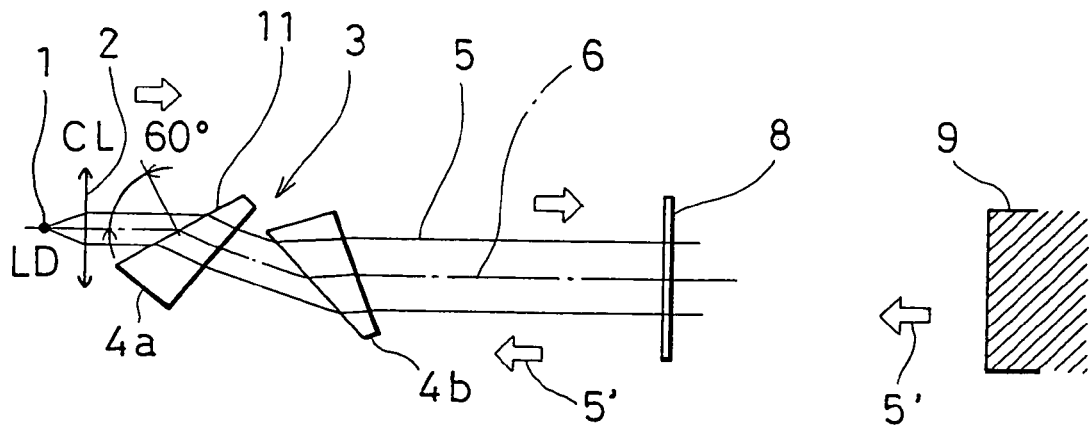
FIG. 1 is a schematical drawing to show an arrangement of an embodiment of the present invention.

Description will be given below on the best mode to carry out the present invention referring to the drawings.

Figure 7:
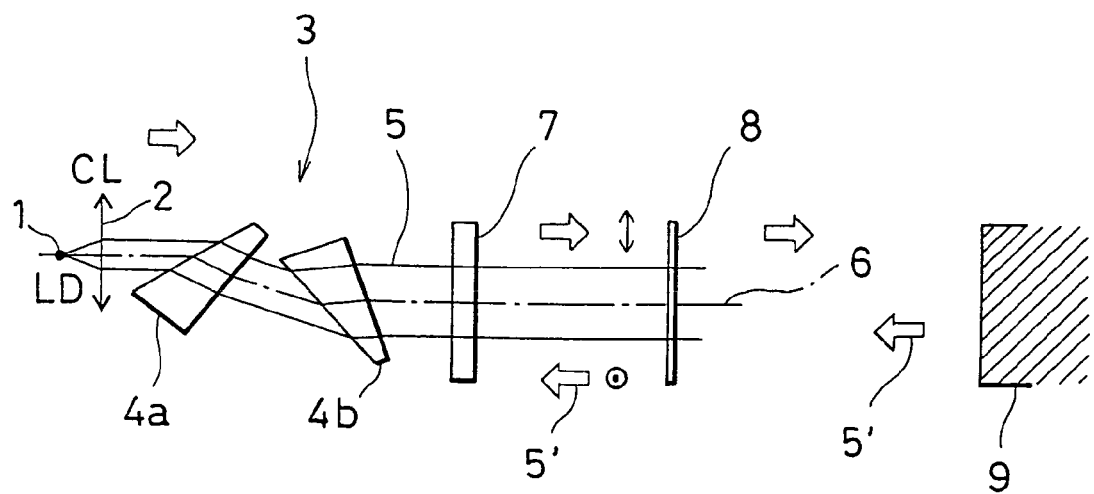
FIG. 7 is a schematical drawing to show an arrangement of a conventional type laser beam projecting device.

First, referring to FIG. 1, description will be given on a basic arrangement of an optical system of a laser beam projecting device. In FIG. 1, the same component as shown in FIG. 7 is referred by the same symbol.

A laser beam 5 from a semiconductor laser 1 is shaped by the anamorphic prism 3 and the laser beam 5 is projected. A ¼λ plate 8 is provided on a projection optical axis 6 of the laser beam 5.

A wavelength selecting film 11 is formed on at least one surface of wedge-like prisms 4a and 4b, which constitute the anamorphic prism 3, e.g. on a surface facing to the semiconductor laser 1 of the wedge-like prism 4a. By forming the wavelength selecting film 11 on the surface which is tilted at an angle of 45° or more with respect to an incident axis of the laser beam, the wavelength selecting film 11 fulfills the function as a beam splitter.

Next, description will be given on characteristics of the wavelength selecting film 11 referring to FIG. 2 (A), FIG. 2 (B), FIG. 2 (C), FIG. 3 (A), FIG. 3 (B), and FIG. 3 (C).

Figure 2A:
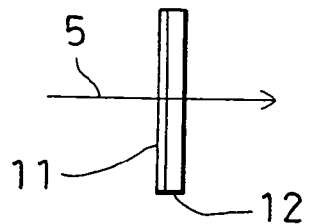
FIG. 2 (A), FIG. 2 (B) and FIG. 2 (C) each represents a drawing to explain relation of a wavelength selecting film formed on a transparent plate with an incident angle of a laser beam.
Figure 2B:
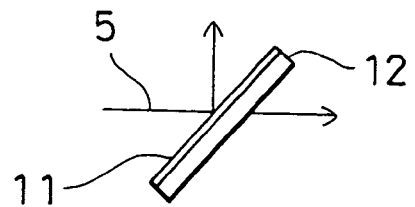
Figure 2C:
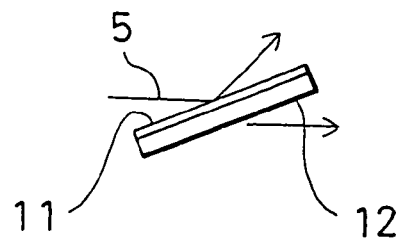

FIG. 2 (A), FIG. 2 (B) and FIG. 2 (C) each represents a case where the wavelength selecting film 11 (long-pass filter or short-pass filter) is formed on a transparent plate 12, the laser beam 5 enters to the transparent plate 12, and an incident angle is changed to 0°, 45° and 60° respectively. FIG. 3 (A), FIG. 3 (B) and FIG. 3 (C) each represents changes of transmittance of a P-polarizing component and a S-polarizing component in each case. In FIG. 3 (B) and FIG. 3 (C), a symbol P represents a transmittance curve of the P-polarizing component, and a symbol S represents a transmittance curve of the S-polarizing component.

When the laser beam 5 enters the transparent plate 12, i.e. the wavelength selecting film 11, at an incident angle of 0°, i.e. at a right angle as shown in FIG. 2 (A), the state of transmittance with respect to a wavelength of the laser beam 5 is the same for both the P-polarizing component and the S-polarizing component. At an wavelength of λA, the transmittance exceeds about 90%. In this case, the wavelength selecting film 11 is a mere wavelength selecting film.

Figure 3A:
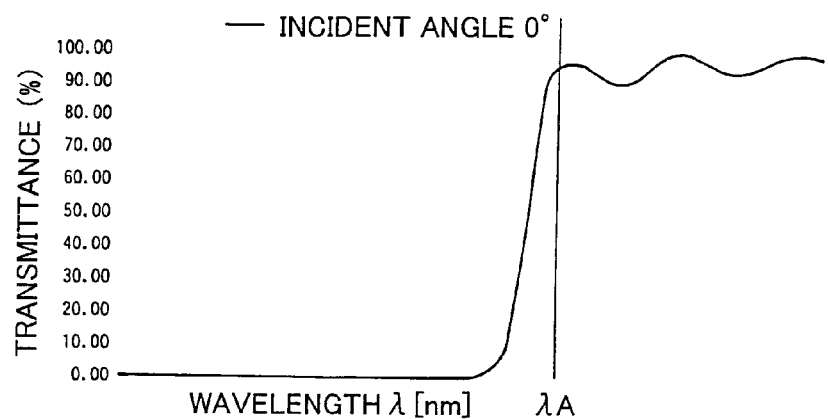
FIG. 3 (A), FIG. 3 (B) and FIG. 3 (C) each represents a drawing to explain relation of an incident angle of the laser beam with respect to the wavelength selecting film with transmittance.
Figure 3B:
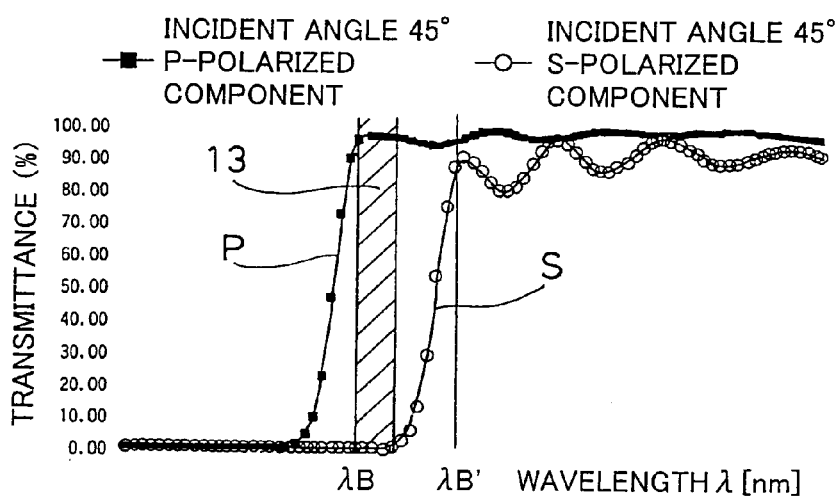
Figure 3C:
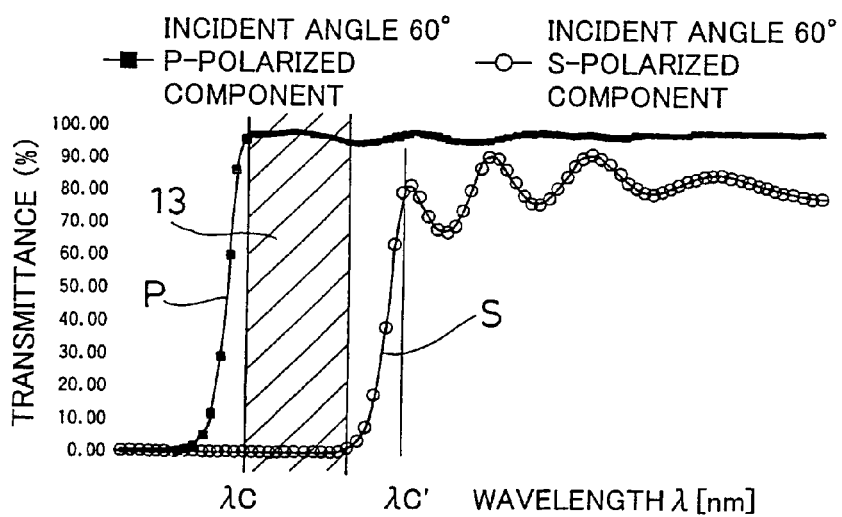

Next, when the laser beam 5 enters the wavelength selecting film 11 at an incident angle of 45° as shown in FIG. 2 (B), a transmission wavelength of the laser beam 5 is shifted toward a short wavelength side in both the P-polarizing component and the S-polarizing component as shown in FIG. 3 (B), and the transmittance exceeds about 90% at the wavelength of λB for the P-polarizing component and at the wavelength of λB' for the S-polarizing component. Further, an amount of shift is higher in the P-polarizing component, and there is occurred an area 13 (as shown by diagonal lines in FIG. 3 (B)) in which the P-polarized component passes through while the S-polarizing component is shut off. Therefore, the wavelength selecting film 11 fulfills the equivalent function to a polarizing plate with respect to the wavelength, which is included in the area 13.

Further, when the laser beam 5 enters the wavelength selecting film 11 at an incident angle of 60° as shown in FIG. 2 (C), the transmission wavelength of the laser beam 5 is shifted further toward the short wavelength side for both the P-polarizing component and the S-polarizing component as shown in FIG. 3 (C), and the transmittance exceeds about 90% at the wavelength of λC for the P-polarizing component and at λC' for the S-polarizing component. The difference of the transition amount between the P-polarizing component and the S-polarizing component increases further. The area 13 (shown by diagonal lines in FIG. 3 (C)), in which the P-polarising component passes through while the S-polarizing component is shut off, becomes larger than the case where the incident angle is 45°. In the case where the incident angle is 60°, too, the wavelength selecting film 11 fulfills the equivalent function to that of the polarizing plate with respect to the wavelength, which is included in the area 13.

Thus, as shown in FIG. 2 (C) and FIG. 3 (C), in case the wavelength selecting film 11 is tilted at an angle of 60° with respect to the incident angle and the laser beam 5 with the wavelength included in the area 13 is used, the wavelength selecting film 11 can be used as a polarizing plate which transmits the P-polarizing component but shuts off the S-polarizing component.

By using the characteristics of the wavelength selecting film 11 as described above, the wavelength selecting film 11 is formed on at least one surface of the wedge-like prisms 4a and 4b, and the wavelength selecting film 11 is tilted at an angle as required, e.g. at 60° with respect to the laser beam 5.

The P-polarized laser beam 5 emitted from the semiconductor laser 1 has a wavelength included in the area 13. The laser beam 5 is turned to parallel luminous flux by the condenser lens 2. The P-polarized laser beam 5 passes through the wavelength selecting film 11, and cross-section of the luminous flux is shaped in circular shape by the wedge-like prisms 4a and 4b of the anamorphic prism 3. After passing trough the anamorphic prism 3, the laser beam 5 is converted to a circularly polarized light by the ¼λ plate 8 and is projected to the optical component 9. As the reflected laser beam 5' reflected by the optical component 9 passes through the ¼λ plate 8 again, the laser beam 5 is converted to an S-polarized light. The S-polarized reflected laser beam 5' is shut off by the wavelength selecting film 11 and does not reach the semiconductor laser 1.

It is suffice that the tilt angle of the wavelength selecting film 11 is determined so that there is a difference in the transmitting characteristics of P-polarizing component and S-polarizing component, and so that the area 13 can be obtained. A tilt angle in the range of 40° to 80°, or more preferably in the range of 60° to 70°, is selected, for instance. If variation in a wavelength of LD, variation in film, etc. is taken into account, a wavelength range to be used as a polarizing beam splitter should be wider, and it is preferable that the incident angle is 60° or more. However, increase of the incident angle means the tilting of the component. If the incident angle is made too large, larger space is required and is not preferable. Thus, the incident angle is preferably in the range of 60° to 70°.

According to the present invention, the return beam can be shut off without providing a polarizing plate separately.

Figure 4:
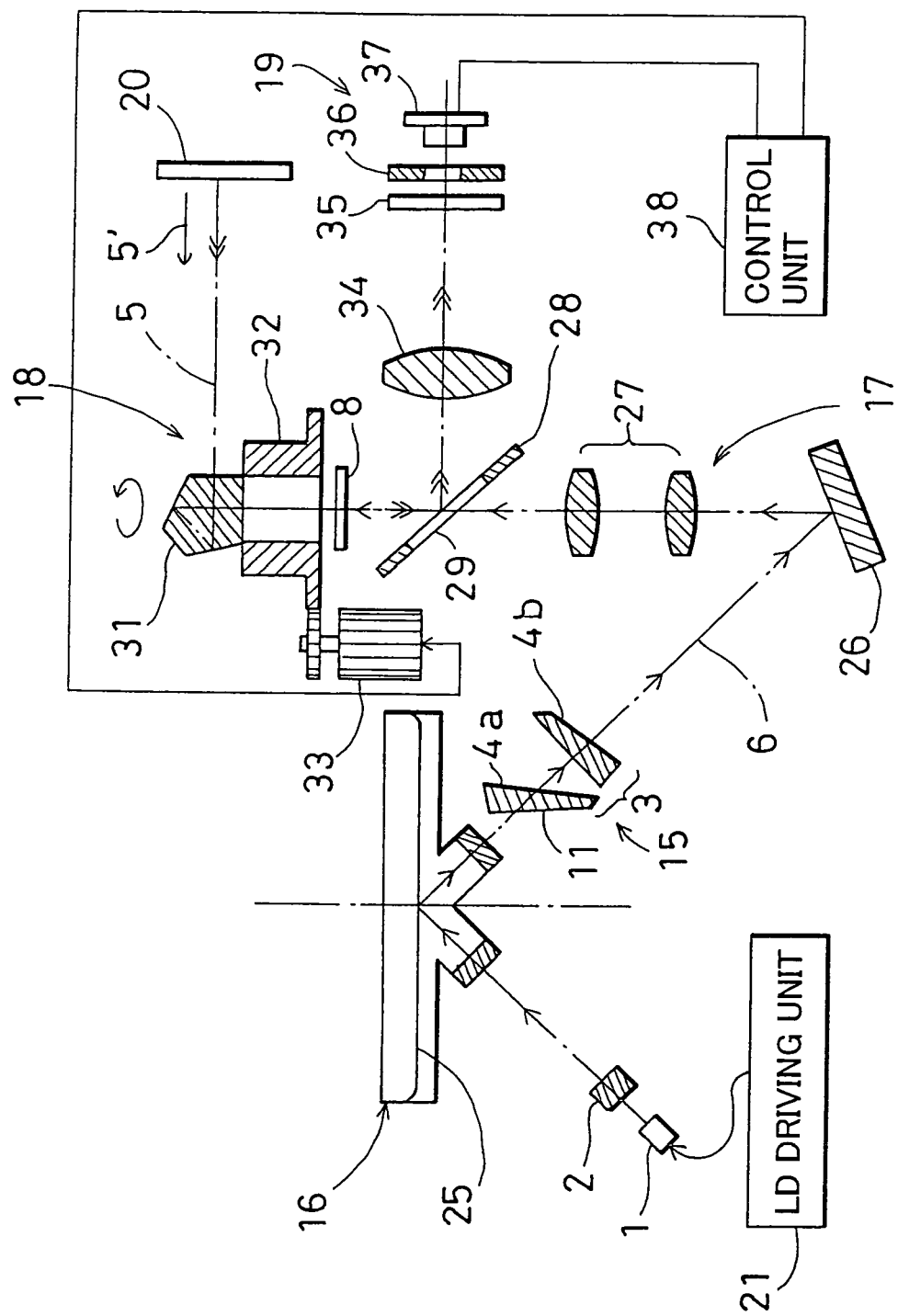
FIG. 4 is a schematical drawing of a laser rotary irradiating system according to the present invention.
Figure 5:
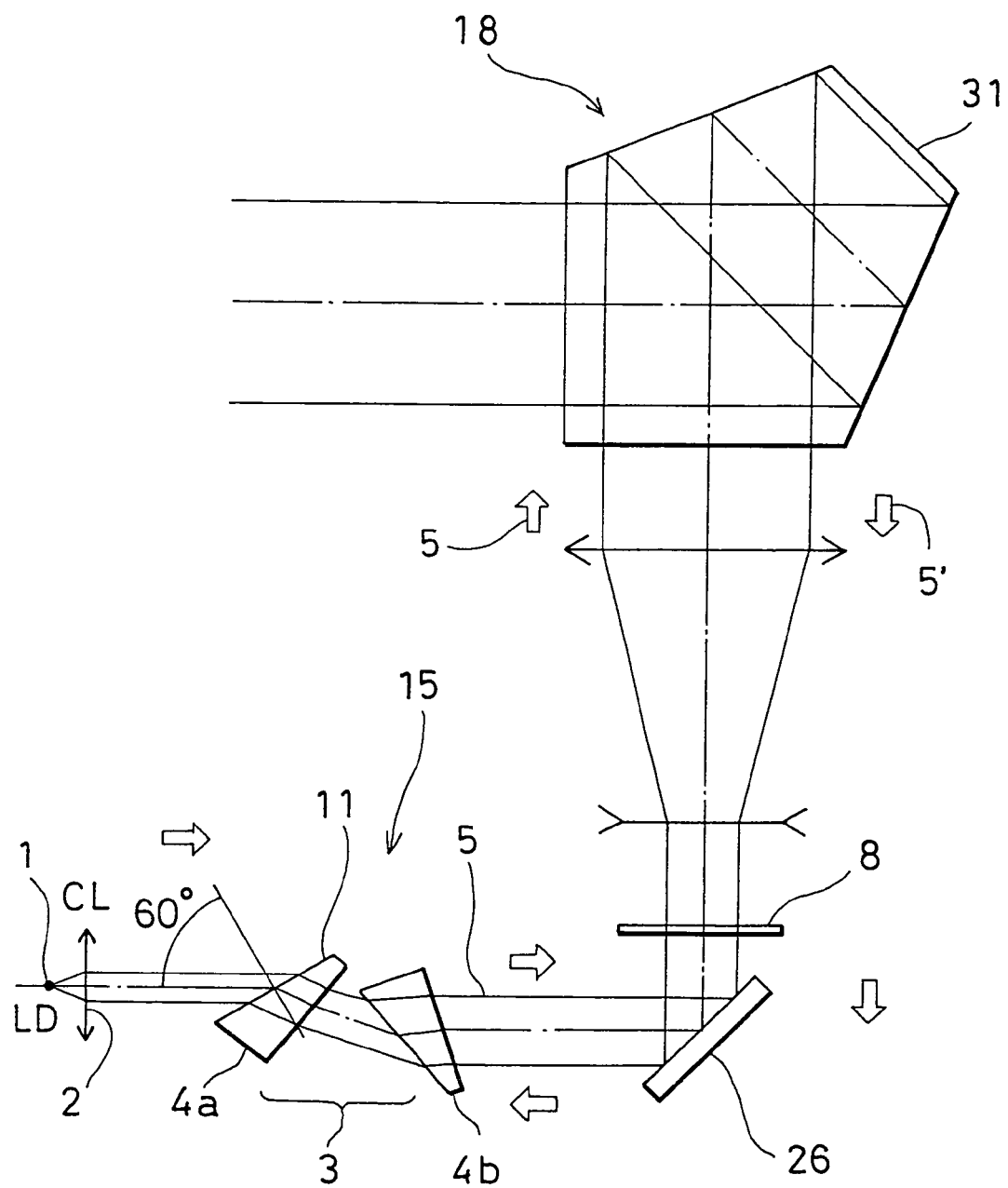
FIG. 5 is a schematical drawing to show an essential portion of an optical system of the laser rotary irradiating system.
Figure 6:
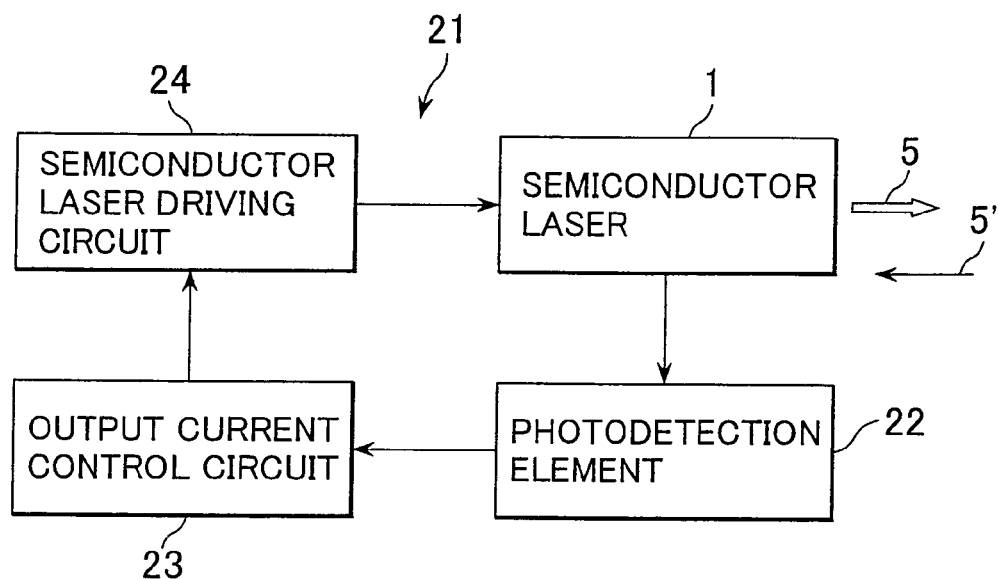
FIG. 6 is a block diagram of an LD driving unit of the laser rotary irradiating system.

Referring to FIG. 4 to FIG. 6, description will be given below on an example of a surveying system comprising the laser beam projecting-device according to the present invention. In FIG. 4 to FIG. 6, the same component as shown in FIG. 1 is referred by the same symbol.

The surveying system is a laser rotary irradiating system for forming a horizontal reference plane by irradiating a laser beam in a horizontal direction by rotary irradiation. The laser rotary irradiating system primarily comprises a laser beam projecting device 15, a tilt correcting system 16, a projection optical system 17, a rotary irradiating unit 18, and a photodetection system 19.

For a laser beam 5 emitted from the semiconductor laser 1, tilting of an optical axis is corrected at the tilt correcting system 16. Then, the laser beam 5 is projected along a vertical optical axis by the projection optical system 17. The rotary irradiating unit 18 deflects the laser beam 5 in a horizontal direction and projects the laser beam 5 by rotary irradiation. The laser beam 5 thus irradiated forms a horizontal reference plane. As the laser beam 5 crosses a reflecting object 20, the laser beam 5 is reflected by the reflecting object 20. A reflected laser beam 5' passes through the rotary irradiating unit 18 and is received and detected by the photodetection system 19. At the photodetection system 19, a position, a direction, etc. of the reflecting object 20 are detected.

Light emission from the semiconductor laser 1 is driven and controlled by an LD driving unit 21 as shown in FIG. 6. A part of the laser beam 5 emitted from the semiconductor laser 1 is split, and is then detected by a photodetection element 22 such as a photodiode, etc. A result of photodetection is fed back to an output current control circuit 23. Based on a photodetection signal, the output current control circuit 23 issues a control signal to control light intensity of the laser beam 5 to a certain fixed level and sends the control signal to a semiconductor laser driving circuit 24. Based on the control signal, the semiconductor laser driving circuit 24 drives the semiconductor laser 1.

The tilt correcting system 16 has a free liquid surface 25. The laser beam 5 emitted from the semiconductor laser 1 is reflected by the free liquid surface 25. As a result, even when the laser rotary irradiating system is installed with tilting, the projection optical axis of the projection optical system 17 is corrected to a vertical direction and the tilting can be corrected.

On the projection optical axis 6 from the tilt correcting system 16 to the projection optical system 17, the anamorphic prism 3 is provided, and one of the surfaces of the wedge-like prisms 4a and 4b constituting the anamorphic prism 3 is tilted at an angle as required with respect to the projection optical axis 6. For instance, the incident surface of the wedge-like prism 4a is tilted at an angle of 60° with respect to the projection optical axis 6 as shown in FIG. 1, and the wavelength selecting film 11 is formed on the incident surface of the wedge-like prism 4a.

The projection optical system 17 comprises a reflecting mirror 26 for deflecting the laser beam 5 in a vertical direction after the laser beam 5 has passed through the anamorphic prism 3, a beam expander 27 for expanding a diameter of the luminous flux of the laser beam 5 on a reflection light optical axis of the reflecting mirror 26, an aperture reflecting mirror 28, and the ¼λ plate 8 which is a component element of the laser beam projecting device 15.

The rotary irradiating unit 18 comprises a pentagonal prism 31, which deflects the laser beam 5 in a horizintal direction after the laser beam 5 has passed through an aperture 29 of the aperture reflecting mirror 18 and the ¼λ plate 8. The pentagonal prism 31 is arranged on a rotary holder 32 with a hollow portion inside. When the rotary holder 32 is rotated by a rotating motor 33, the laser beam 5 projected from the rotary holder 32 is projected by rotary irradiation.

Being reflected by the reflecting object 20, the reflected laser beam 5' enters through the rotary irradiating unit 18 and is deflected by the aperture reflecting mirror 28 toward the photodetection system 19.

The photodetection system 19 comprises a condenser lens 34, a polarizing plate 35, a pinhole plate 36, and a photodetection element 37, and the photodetection system 19 can receive and detect the reflected laser beam 5' from the reflecting object 20. The polarizing plate 35 is arranged to allow the S-polarizing component to pass.

A photodetection signal from the photodetection element 37 is sent to a control unit 38. Based on the photodetection signal, the control unit 38 controls rotation of the rotating motor 33 in such manner that, for instance, reciprocal scanning is performed at an angle as required around the reflecting object 20.

Next, description will be given on operation of the laser beam 5 and the reflected laser beam 5' of the laser rotary irradiating system.

From the semiconductor laser 1, the P-polarized linear laser beam 5 is emitted and has a wavelength included in the area 13. After being reflected by the free liquid surface 25, the laser beam 5 passes through the wavelength selecting film 11. The form of the laser beam is shaped by the anamorphic prism 3, and the laser beam 5 is deflected in a vertical direction by the reflecting mirror 26, and the beam diameter is expanded as required. After passing through the aperture 29, and further, through the ¼λ plate 8, the laser beam 5 is converted to a circularly polarized light. At the rotary irradiating unit 18, the laser beam 5 is deflected in a horizontal direction and is projected by rotary irradiation.

After being reflected by the reflecting object 20, the reflected laser beam 5' enters through the rotary irradiating unit 18. Then, the reflected laser beam 5' passes through the ¼λ plate 8 again, and the reflected laser beam 5' is converted to an S-polarized linearly polarized light.

The reflected laser beam 5' is reflected by the aperture 29 toward the photodetection system 19 and is converged to a photodetection surface of the photodetection element 37 by the condenser lens 34. The polarizing plate 35 allows only the S-polarizing component to pass and shuts off the other disturbance light. The pinhole plate 36 allows a luminous flux of a limited portion on the optical axis to pass and shuts off the other disturbance light so that only the reflected laser beam 5' from the reflecting object 20 is received by the photodetection element 37.

After passing through the ¼λ plate 8, a part of the reflected laser beam 5' passes through the aperture 29 and enters the laser beam projecting device 15 as a return beam. Because the wavelength selecting film 11 is tilted so that the P-polarized light is allowed to pass, the reflected laser beam 5', i.e. S-polarized light, is shut off by the wavelength selecting film 11 and does not enter the semiconductor laser 1. Therefore, decrease of output of the semiconductor laser 1 is prevented, and the laser beam 5 in stable condition is emitted from the semiconductor laser 1.

In addition to the reflected light from the reflecting object 20, a reflected light from the surfaces of optical components such as the pentagonal prism 31, etc. is included in the reflected laser beam 5' as shown in FIG. 5. These reflected light components are converted to S-polarized lights when the light components pass through the ¼λ plate 8 in an outgoing course and in a return course, and these reflected light components are shut off by the wavelength selecting film 11.

The ¼λ plate may be provided separately on each of the laser beam projecting device 15 and the photodetection system 19 respectively. For instance, ¼λ plates may be provided between the anamorphic prism 3 and the reflecting mirror 26 and may be provided between the aperture reflecting mirror 28 and the condenser lens 34 respectively.

In the above, description has been given on a case where the present invention is provided on a laser rotary irradiating system, while the present invention may be provided on an electro-optical (light wave) distance measuring system, etc. The present invention can be introduced in the same manner to an optical system, for which it is necessary to eliminate influence of the return beam.

What is claimed is:

1. A surveying system, comprising a laser beam projecting device, a projecting optical system for projecting a laser beam from said laser beam projecting device toward a reflecting object, and a photodetection system having a photodetection element and for guiding a reflected laser beam from said reflection object toward said photodetection element, wherein said laser beam projecting device comprises a semiconductor laser light source for emitting a laser beam having a cross-section in an elliptical shape and having P-polarized light, an anamorphic prism for changing the shape of the cross-section of the laser beam into a circular shape, a birefringent optical component for converting the P-polarized light to a circularly polarized light when said laser beam having the P-polarized light transmitted by said anamorphic prism passes through and for converting the circularly polarized light to S-polarized light when the reflected laser beam having the circularly polarized light passes through again, and a wavelength selecting film formed on one surface of said anamorphic prism, wherein said anamorphic prism has a surface tilted in such a manner that an incident angle of the laser beam is in a range of 45° to 80°, and said wavelength selecting film is formed on said titled surface in such a manner that the incident angle of the laser beam is in a range of 45° to 80°, wherein tilting in a range of 45° to 80° of said wavelength selecting film shifts the transmission wavelength range of said P-polarized light to the shorter wavelength side than the transmission wavelength range of said S-polarized light, said wavelength selecting film has a function of a polarization plate to transmit said P-polarized light and to shut off said S-polarized light at the wavelength range of the shifted amount, and wherein said transmission wavelength range of said wavelength selecting film is set so as to include the wavelength of the laser beam emitted from said laser light source.

2. A surveying system according to claim 1, wherein said wavelength selecting film is formed on one surface of wedge-like prisms, which constitute said anamorphic prism.

3. A surveying system according to claim 1, wherein said wavelength selecting film is tilted in such a manner that the incident angle of the laser beam is in a range of 60° to 70°.

4. A surveying system according to claim 1, wherein said wavelength selecting film is a long-pass filter or a short-pass filter.

5. A surveying system according to claim 1, further comprising a rotating prism rotatably mounted and for deflecting the laser beam projected from said birefringent component toward an object.

6. A surveying system according to claim 3, further comprising a rotating prism rotatably mounted and for deflecting the laser beam projected from said birefringent component toward an object.

7. A surveying system according to claim 1, wherein said projecting optical system comprises an aperture mirror, wherein the laser beam from said laser beam projecting device is projected through said aperture mirror, and the reflected laser beam from said reflecting object is reflected by said aperture mirror and directed toward said photodetection system.

* * * * *